(12) United States Patent
Fukuda et al.

(10) Patent No.: US 6,329,262 B1
(45) Date of Patent: Dec. 11, 2001

(54) METHOD FOR PRODUCING SEMICONDUCTOR INTEGRATED CIRCUIT

(76) Inventors: Takeshi Fukuda, 3-8-28, Kosobe-cho, Takatsuki-shi, Osaka; Hiroshi Takenaka, 2-20-4, Kotari, Nagaokakyo-shi, Kyoto; Hidetoshi Furukawa, 20-1, Shin'ashiyashimo; Takeshi Fukui, 4-24-3-210, Minami-suita, both of Suita-shi, Osaka; Daisuke Ueda, 1-20-B-501, Minami-kasugaoka, Ibaraki-shi, Osaka, all of (JP)

( * ) Notice: Subject to any disclaimer, the term of this patent is extended or adjusted under 35 U.S.C. 154(b) by 0 days.

(21) Appl. No.: 09/256,738

(22) Filed: Feb. 24, 1999

Related U.S. Application Data

(62) Division of application No. 08/988,799, filed on Dec. 11, 1997, now Pat. No. 6,025,632.

(30) Foreign Application Priority Data

Dec. 16, 1996 (JP) .................................................. 8-335333

(51) Int. Cl.$^7$ .................................................. H01L 21/62
(52) U.S. Cl. .............................. 438/385; 438/10; 438/17
(58) Field of Search .............................. 438/10, 17, 384, 438/385, FOR 220, FOR 330, FOR 429

(56) References Cited

U.S. PATENT DOCUMENTS

| | | |
|---|---|---|
| 3,308,528 | 3/1967 | Bullard et al. . |
| 3,781,839 | 12/1973 | Bodge . |
| 4,609,903 | 9/1986 | Toyokura et al. . |
| 4,760,369 | * 7/1988 | Tiku . |
| 4,782,202 | * 11/1988 | Sawae et al. . |
| 4,851,792 | 7/1989 | Ochiai et al. . |
| 4,879,683 | * 11/1989 | Garcia . |
| 5,440,174 | 8/1995 | Nishitsuji . |
| 5,567,647 | * 10/1996 | Takahashi . |
| 5,794,187 | * 8/1998 | Franklin et al. . |
| 5,867,083 | 2/1999 | Takeuchi et al. . |

FOREIGN PATENT DOCUMENTS

| | | |
|---|---|---|
| 0454133 | 10/1991 | (EP) . |
| 992464 | 5/1965 | (GB) . |
| 2-44701 | 2/1990 | (JP) . |
| 4-56319 | * 2/1992 | (JP) . |
| 4-20654 | * 7/1992 | (JP) . |

* cited by examiner

Primary Examiner—George Fourson
Assistant Examiner—Joanie A. Garcia

(57) ABSTRACT

A semiconductor integrated circuit includes a thermal resistor which is made of a tungsten silicon nitride containing at least about 5% by weight of silicon and formed on a semiconductor substrate directly or via an insulating film. The semiconductor integrated circuit is produced by a method including the steps of: forming a tungsten silicide nitride film on a semiconductor substrate; patterning the tungsten silicide nitride film in a predetermined pattern to form a thermal resistor; and forming a pair of electrodes to be connected to the thermal resistor. The semiconductor integrated circuit is provided so as to have a predetermined resistance by measuring electric characteristics of the semiconductor integrated circuit; obtaining a difference between the measured electric characteristics and desired electric characteristics to calculate a required adjusting amount of a resistance of the thermal resistor; and adjusting the resistance of the thermal resistor by the adjusting amount through heating of the thermal resistor with electric power.

5 Claims, 6 Drawing Sheets

| Resistor | WSiN film containing about 30% by weight of Si |
|---|---|
| Underlying insulation film | SiO$_2$ |
| Thickness of a SiO$_2$ film | 2μm |
| Thickness of a resistor | 0.1μm |
| Width of a resistor | 20μm |
| Length of a resistor | 100μm |
| Power-supplying time | 10msec |

METHOD FOR PRODUCING SEMICONDUCTOR INTEGRATED CIRCUIT

This is a division of application Ser. No. 08/988,799, filed Dec. 11, 1997, now U.S. Pat. No. 6,025,632.

BACKGROUND OF THE INVENTION

1. Field of the Invention

The present invention relates to a semiconductor integrated circuit including a tungsten silicide nitride (WSiN) film formed on a semiconductor substrate and a method for producing the same.

2. Description of the Related Art

In order to realize a temperature-compensating function by compensating for temperature characteristics of a semiconductor integrated circuit (hereinafter, also simply referred to as an "integrated circuit"), a thermal resistor is generally used. Hereinafter, a prior art semiconductor integrated circuit using a thermal resistor will be described.

Specifically, a thermal resistor made of a metal oxide, or the like, having a negative temperature coefficient is provided as a thermistor resistor at an external position of an integrated circuit in such a manner as to be thermally connected to the integrated circuit, whereby a temperature-compensating function is realized by utilizing the changes in resistance of the thermistor resistor due to the increase in temperature. Japanese Laid-open publication No. 2-44701 discloses a method in which a thermal resistor made of a tungsten nitride (WN) film is provided in an integrated circuit, and the resistance of the resistor is adjusted by annealing.

However, with the structure in which a thermistor resistor is externally provided to an integrated circuit, the size of the thermistor resistor is generally almost the same as that of the integrated circuit, so that the size of an entire circuit obtained by using the integrated circuit becomes large. Furthermore, according to the conventional technique, it is difficult to produce a thermistor resistor having a desired temperature coefficient with good precision, and the resultant thermistor resistor has temperature coefficient characteristics varied in a wide range. Therefore, it is required that a thermistor resistor having appropriate temperature coefficient characteristics be selected.

According to the above-mentioned method in which a thermal resistor made of a WN film is provided in an integrated circuit, and the resistance of the resistor is adjusted by annealing, the entire semiconductor wafer is heated by annealing. Therefore, there is a possibility that other circuit elements formed on the wafer are subject to damage during annealing. Furthermore, the changes in wafer temperature may be delayed in terms of time at the beginning and ending of heating during annealing, which prevents the resistance from being adjusted with good precision. In addition, it is difficult to complete the adjustment of the resistance within a short period of time.

In addition, although the WN film can be formed so as to have a negative temperature coefficient suitable for a thermistor resistor, the temperature coefficient cannot be set to be large enough. Furthermore, depending upon the production conditions, the temperature coefficient becomes positive, causing problems with using a thermistor resistor which should exhibit a temperature-compensating function.

SUMMARY OF THE INVENTION

The semiconductor integrated circuit of the present invention includes a thermal resistor which is made of tungsten silicide nitride containing at least about 5% by weight of silicon and formed on a semiconductor substrate directly or via an insulating film.

The thermal resistor may be a thermistor resistor for compensating for temperature characteristics of a circuit formed on the semiconductor substrate.

The method for producing a semiconductor integrated circuit of the present invention includes the steps of: forming a semiconductor integrated circuit including a thermal resistor made of tungsten silicide nitride; measuring electric characteristics of the semiconductor integrated circuit; obtaining a difference between the measured electric characteristics and desired electric characteristics to calculate a required adjusting amount of a resistance of the thermal resistor; and adjusting the resistance of the thermal resistor by the adjusting amount through current-carrying heating of the thermal resistor.

Preferably, the current-carrying heating is conducted by using a current source.

The method for producing a semiconductor integrated circuit, which is provided in accordance with another aspect of the present invention, includes the steps of: forming a tungsten silicide nitride film on a semiconductor substrate; patterning the tungsten silicide nitride film in a predetermined pattern to form a thermal resistor; and forming a pair of electrodes to be connected to the thermal resistor.

The method may further include the step of forming another circuit portion on the semiconductor substrate.

In one embodiment, the tungsten silicide nitride film is formed by reactive sputtering in a reduced-pressure atmosphere containing nitride gas with a target made of tungsten silicide containing silicon.

Thus, the invention described herein makes possible the advantage of providing: (1) a semiconductor integrated circuit in which a temperature-compensating thermistor resistor having a large temperature coefficient is internally provided, and the resistance of the thermistor resistor can be adjusted without giving damage to other semiconductor devices; and (2) a method for producing the same.

This and other advantages of the present invention will become apparent to those skilled in the art upon reading and understanding the following detailed description with reference to the accompanying figures.

DESCRIPTION OF THE PREFERRED EMBODIMENTS

Embodiment 1

Figure 1:
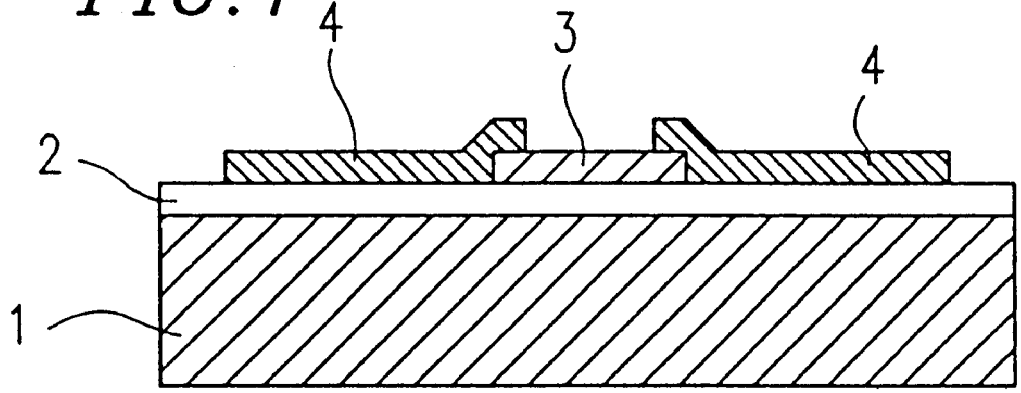
FIG. 1 schematically shows a structure in cross-section of a semiconductor integrated circuit of Embodiment 1 according to the present invention.

FIG. 1 schematically shows a structure in cross-section of a semiconductor integrated circuit of Embodiment 1 according to the present invention.

In this structure, an insulating film 2 is formed on a semiconductor substrate 1, and a thermal resistor 3 made of a WSiN film containing at least about 5% by weight of Si is selectively formed in a predetermined pattern (e.g., stripe shape). Metal electrodes 4 are connected to both ends of the thermal resistor 3.

The structure shown in FIG. 1 is obtained as follows.

First, the insulating film 2 made of $SiO_2$ is formed on the semiconductor substrate 1 made of GaAs, for example, by chemical vapor deposition. The thickness of the insulating film 2 is prescribed to be, for example, about 0.5 μm.

Then, a WSiN film is uniformly formed on the insulating film 2, for example, by reactive sputtering. More specifically, for instance, tungsten silicide (WSi) containing at least about 30% by weight of Si is used as a target for reactive sputtering, and the process is performed under the condition that the partial pressure of argon is 6 mTorr and that of nitrogen is 4 mTorr, whereby the WSiN film is uniformly formed to a thickness of about 0.05 μm.

Next, the WSiN film thus formed is patterned to a predetermined pattern by reactive ion etching and photolithography using, for example, sulfur hexafluoride ($SF_6$) gas, whereby the thermal resistor 3 made of a WSiN film is formed.

Next, a pair of metal electrodes 4 made of, for example, Ti/Au (a two-layer electrode), are formed by a known method so as to be connected to both sides of the thermal resistor 3. Accordingly, the thermal resistor 3 made of a WSiN film is internally formed in an integrated circuit as part of the process for forming the integrated circuit.

The semiconductor substrate 1 may be made of another material such as Si. Other devices such as a transistor and a resistor may be formed on the semiconductor substrate 1 by a known method such as diffusion, injection, and vapor deposition. Furthermore, the insulating film 2 may be made of another material such as silicon nitride (SiN). Alternatively, in the case where the semiconductor substrate 1 is an insulative substrate, the insulating film 2 may be omitted.

A pair of metal electrodes 4 may be connected to any portions of the thermal resistor 3 instead of being connected to both ends of the thermal resistor 3. Furthermore, the above-mentioned specific process such as reactive etching is merely exemplary, and can be replaced by another process generally used in the field of semiconductor technology.

Figure 2:
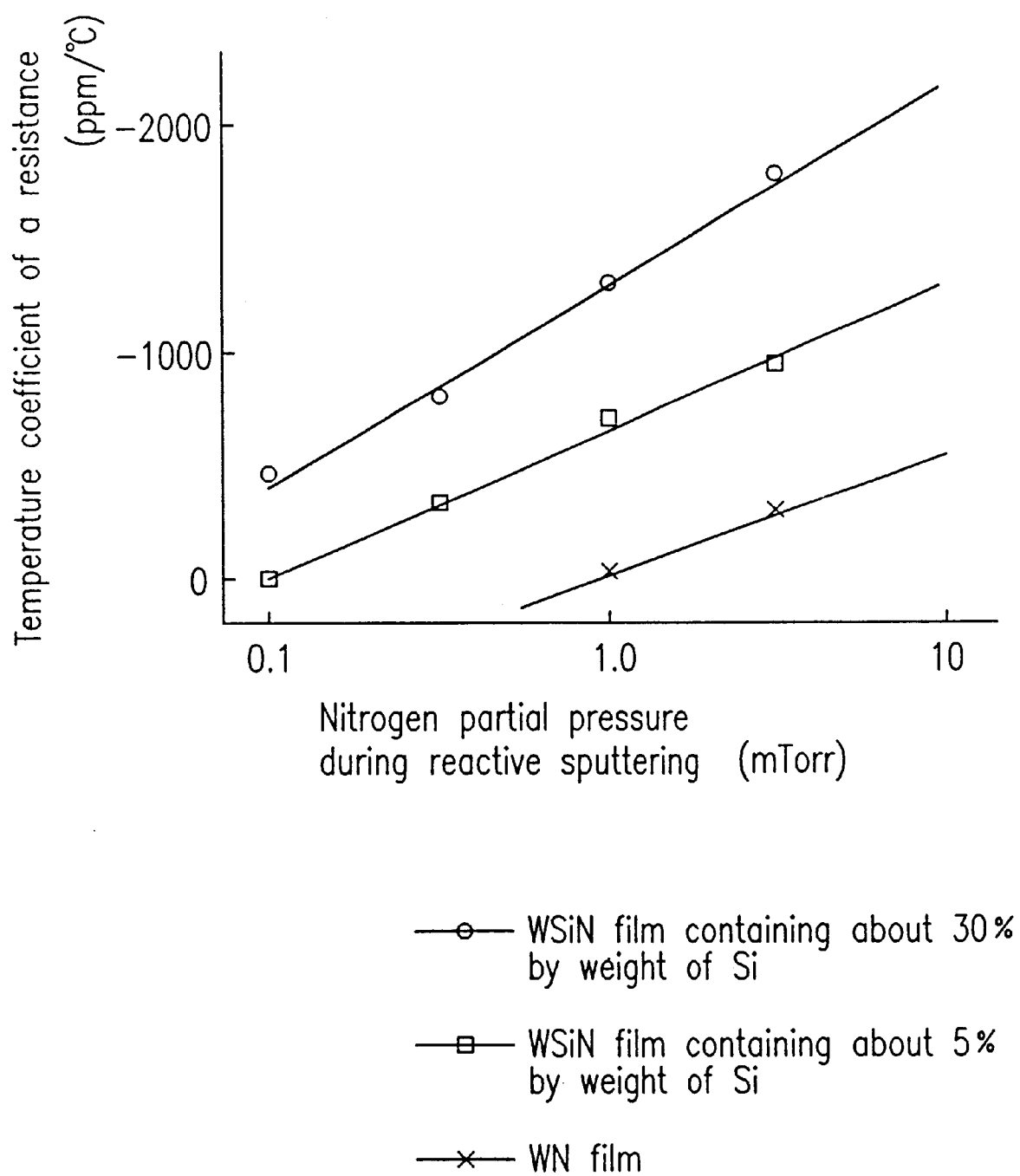
FIG. 2 is a graph showing the relationship between the nitrogen partial pressure and the temperature coefficient of a resistance during reactive sputtering in a thermal resistor made of a WSiN film formed by a process according to the present invention.

FIG. 2 is a graph showing the relationship between the nitrogen partial pressure and the temperature coefficient of a resistance during reactive sputtering with respect to a thermal resistor made of a WSiN film formed by the above-mentioned process according to the present invention. Specifically, FIG. 2 shows data on a thermal resistor made of a WSiN film containing about 30% by weight of Si, data on a thermal resistor made of a WSiN film containing about 5% by weight of Si, and further, data as a comparative example on a thermal resistor made of a WN film.

It is understood from this graph that the thermal resistor made of a WSiN film containing at least about 5% by weight of Si functions as a thermistor resistor having a negative temperature coefficient without fail by prescribing a nitrogen partial pressure during reactive sputtering in the course of production at 0.1 mTorr or higher. Moreover, a thermistor resistor having a desired temperature coefficient can be formed by appropriately selecting a nitrogen partial pressure during reactive sputtering. However, when the nitrogen partial pressure is lower than 0.1 mTorr, a WSiN film having a negative temperature coefficient cannot be formed with good reproducibility.

FIG. 2 further shows that the WSiN film has a larger temperature coefficient than the WN film, and hence, the thermistor resistor made of the WSiN film has more outstanding characteristics than the one made of the WN film.

Figure 3:
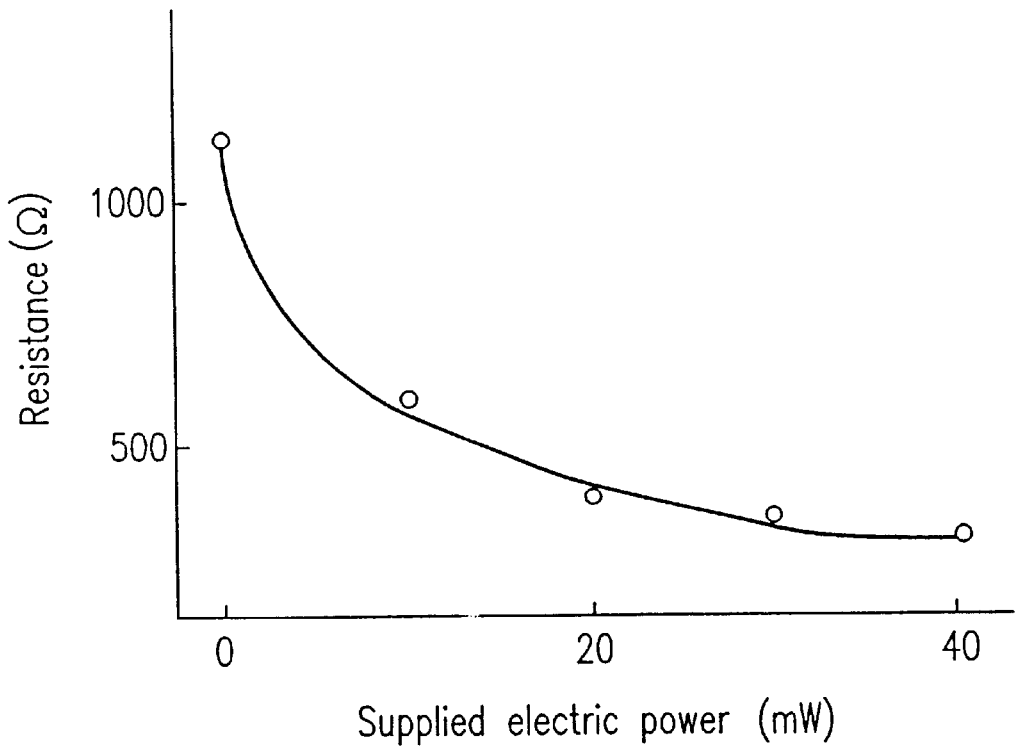
FIG. 3 is a graph showing an exemplary relationship between the supplied electric power value and the resistance of the thermal resistor after being supplied with the power, in the case of supplying predetermined electric power to the thermal resistor made of a WSiN film.

FIG. 3 is a graph showing the relationship between the supplied electric power and the resistance of a thermal resistor after being supplied with the power, in the case where a thermal resistor made of a WSiN film (thickness: about 0.1 μm, width: about 20 μm, and length: about 100 μm) containing about 30% by weight of Si, which is formed on a $SiO_2$ insulating film (thickness: about 2 μm), is supplied with predetermined electric power for about 10 ms.

It is understood from this graph that the resistance of the thermal resistor becomes lower, as the resistor is heated for a short period of time by being supplied with electric power, and the change amount (i.e., the resistance of the resistor after being supplied with electric power) can be adjusted by controlling the supplied electric power.

Embodiment 2

Figure 4:
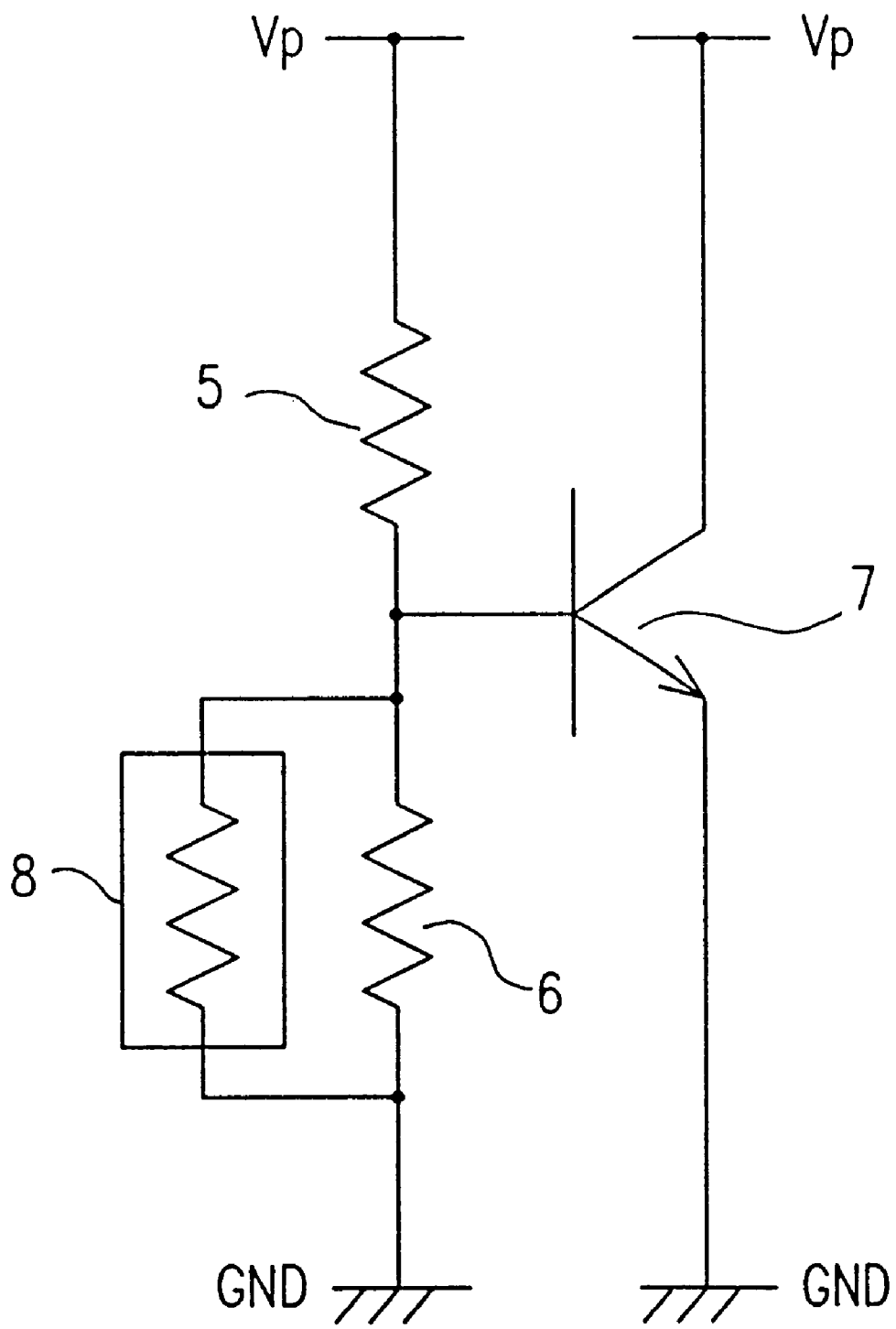
FIG. 4 is a schematic circuit diagram of a semiconductor integrated circuit of Embodiment 2 according to the present invention, in which a thermal resistor made of a WSiN film is internally formed on a semiconductor substrate so as to function as a temperature-compensating thermistor resistor.

FIG. 4 is a schematic circuit diagram of a semiconductor integrated circuit of Embodiment 2 according to the present invention, in which a thermal resistor made of a WSiN film is internally formed on a semiconductor substrate so as to function as a temperature-compensating thermistor resistor.

In the circuit shown in FIG. 4, resistors 5 and 6 are connected in series between a power terminal $V_P$ and a ground terminal GND, a common connecting node between the resistors 5 and 6 is connected to a base terminal of a transistor 7, and a thermal resistor 8 made of a WSiN film is connected to both ends of the resistor 6.

In general, a collector current of a transistor tends to increase due to the increase in temperature. However, in the circuit configuration shown in FIG. 4, the resistance of the thermal resistor 8 made of a WSiN film which has thermistor resistor characteristics decreases with the increase in temperature, and in turn a bias voltage applied to the base terminal of the transistor 7 decreases. Therefore, the increase in current flowing through a collector terminal of the transistor 7 is suppressed even when the temperature increases, and the collector current becomes stable to be a constant value even during the increase in temperature. Furthermore, by appropriately selecting the combination of respective resistance values of the resistors 5 and 6 and a resistance value of the thermal resistor 8, the temperature characteristics of the transistor 7 are completely cancelled, and an appropriate bias voltage can be applied to the base terminal of the transistor 7.

Thus, according to the present invention, the temperature compensation of a transistor included in the integrated circuit can be realized without providing a thermistor resistor made of a metal oxide outside of the integrated circuit, which has been required in the conventional art. Furthermore, since the thermal resistor is internally formed in the integrated circuit, the precision of the temperature compensation is improved.

Embodiment 3

Figure 5:
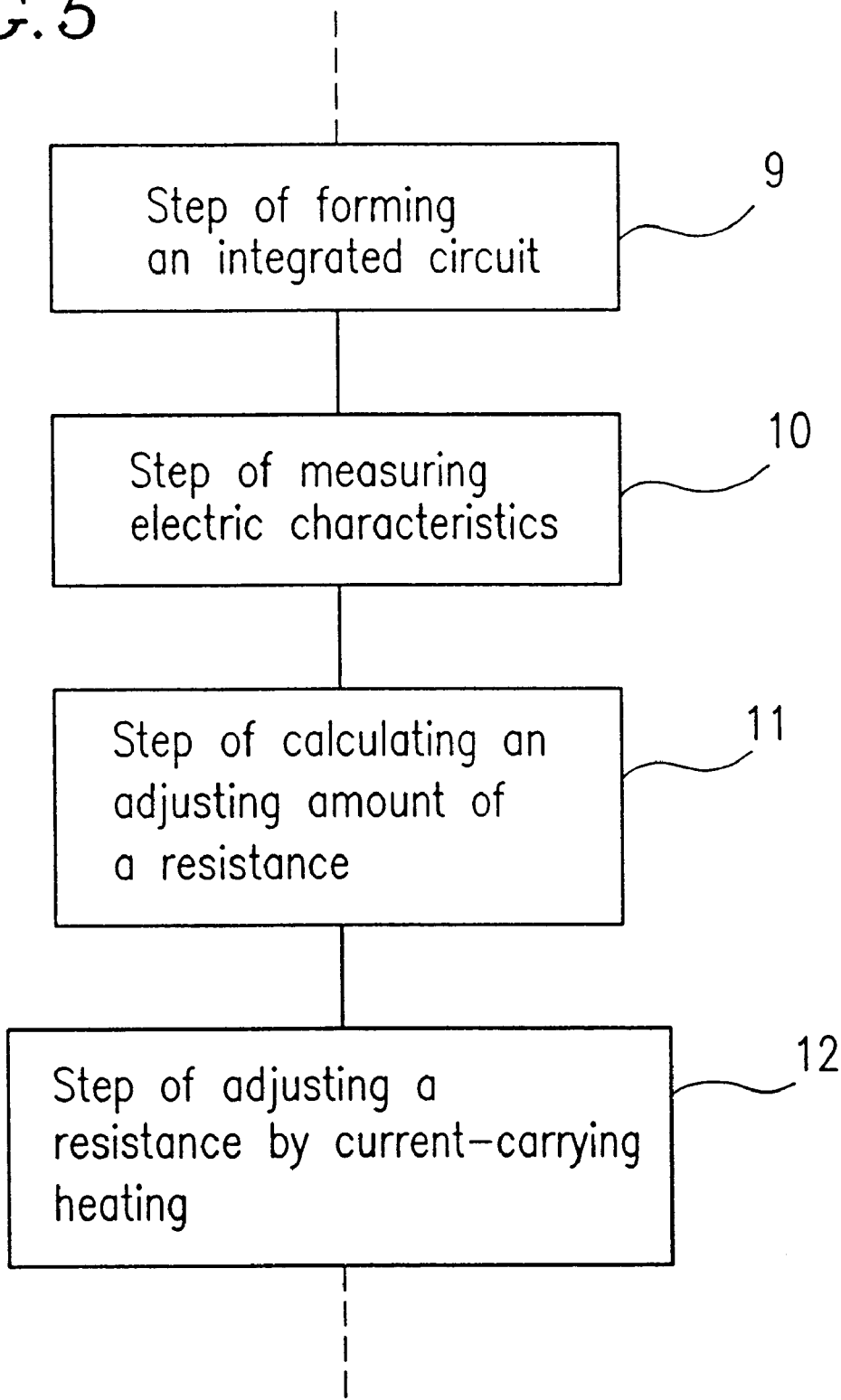
FIG. 5 is a flow chart showing a production process of a semiconductor integrated circuit of Embodiment 3 according to the present invention, including the step of adjusting the resistance of a thermal resistor made of a WSiN film by supplying electric power to the resistor.

FIG. 5 is a flow chart showing a production process of a semiconductor integrated circuit of Embodiment 3 according to the present invention, including the step of adjusting the resistance of a thermal resistor made of a WSiN film by heating the resistor by supplying electric power thereto (current-carrying heating).

Specifically, first, at a step 9 of forming an integrated circuit, an integrated circuit including a thermal resistor made of a WSiN film is formed on a semiconductor substrate as described above. Then, at a step 10 of measuring electric characteristics, the electric characteristics of the thermal resistor or the like included in the integrated circuit thus formed are measured. Therefore, at a step 11 of calculating an adjusting amount of a resistance, a difference between the characteristic value measured at the step 10 and a desired characteristic value is obtained, and the adjusting amount of the resistance is calculated based thereon. At a step 12 of adjusting a resistance by supplying electric power to the resistor, the resistor is heated by being supplied with predetermined electric power for a predetermined period of time, and the resistance is changed only by the calculated adjusting amount.

The resistance of the thermal resistor made of a WSiN film can be set at a desired value by allowing the resistor to undergo each of the above-mentioned steps. Thus, a semiconductor integrated circuit with a temperature-compensating function therein can be formed.

What should be noted here is that the thermal resistor made of a WSiN film has already had thermistor resistance characteristics, and the resistor has its resistance decreased by current-carrying heating. Therefore, when the resistor is subjected to current-carrying heating with a voltage source, there is a possibility that the amount of a supplied current increases with the decrease in resistance as heating proceeds, and heat run-away may be caused. Thus, at the step 12, a current source is desirably used.

As described above, in accordance with the present invention, only the thermal resistor to be adjusted is locally heated by current-carrying heating without damaging other devices in the integrated circuit. Furthermore, the thermal resistor to be adjusted is minute in size. Therefore, the temperature of the resistor can be controlled with higher precision, and the resistance of the resistor can be adjusted with higher precision by a simpler method according to the present invention, compared with a conventional method for adjusting the resistance of the resistor by annealing the entire wafer.

Figure 6:
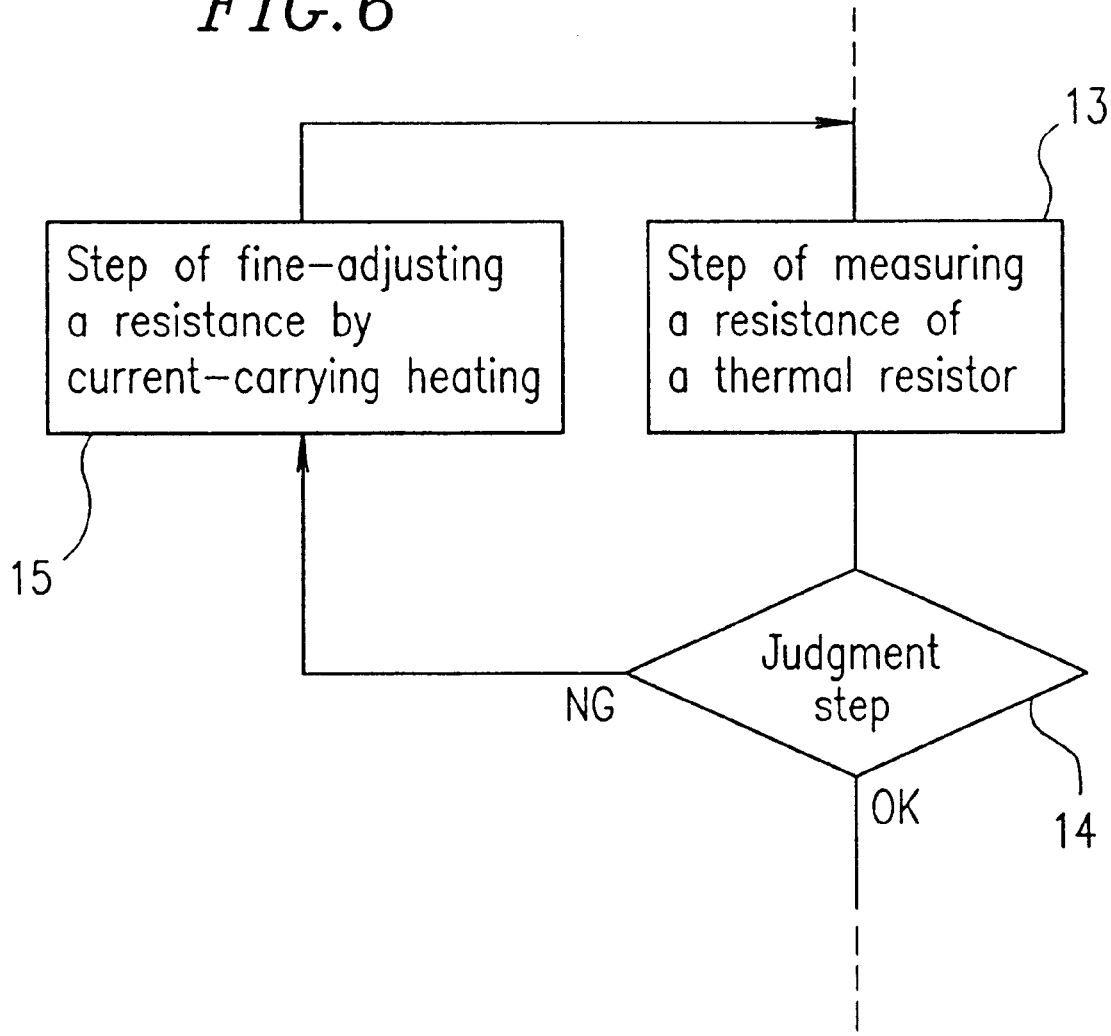
FIG. 6 shows an exemplary modification of the step of adjusting the resistance of a thermal resistor made of a WSiN film by supplying electric power to the resistor shown in FIG. 5.

FIG. 6 shows an exemplary modification of the step 12 of adjusting the resistance of a thermal resistor made of a WSiN film by supplying electric power to the resistor shown in FIG. 5.

Specifically, at a step 13 of measuring a resistance of a thermal resistor, the resistance of a thermal resistor made of a WSiN film is measured, and at a judgement step 14, a desired resistance is compared with the measured value. In the case where the desired value is different from the measured value, at a step 15 of fine-adjusting a resistance by current-carrying heating, the resistance is fine-adjusted by supplying small amount of electric power to the resistor, and thereafter, the step 13 is performed again. These series of steps are repeated until the difference between the measured resistance and the desired resistance becomes a predetermined level or lower.

Accordingly, even when the strict relationship between the supplied electric power and the power-supplying time required for realizing the desired fine-adjustment is unclear, the resistance can be adjusted to the desired value with good precision.

A current flow for realizing the fine-adjustment of resistance of the thermal resistor can be realized by providing small electrode pads, which have such a size as to come into contact with probes, so as to be connected to both terminals of the thermal resistor (i.e., electrodes connected to both ends of the resistor), and supplying a current to the thermal resistor through the probes and the electrode pads in a wafer state.

As described above, according to the present invention, a semiconductor integrated circuit includes a thermal resistor made of a WSiN film containing at least about 5% by weight of Si formed directly, or via an insulating film, on a semiconductor substrate, as a temperature-compensating thermistor resistor. Therefore, a semiconductor integrated circuit including a thermistor resistor having a large temperature coefficient and having a temperature coefficient which is always negative is obtained. Thus, in this integrated circuit, the temperature compensation can be conducted inside the integrated circuit without providing a thermistor device outside of the integrated circuit as in a conventional example. This improves the precision of the temperature compensation and enables an apparatus including the integrated circuit to be entirely smaller.

Furthermore, the resistance of the WSiN film can be irreversibly adjusted by current-carrying heating. Therefore, only the resistor made of the WSiN film is rapidly heated by being supplied with electric power, whereby the resistance of the resistor can be adjusted with a high precision without giving damage to other devices.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing a semiconductor integrated circuit, comprising the steps of:

forming a semiconductor integrated circuit including a thermal resistor made of tungsten silicide nitride;

measuring electric characteristics of the semiconductor integrated circuit;

obtaining a difference between the measured electric characteristics and desired electric characteristics to calculate a required adjusting amount of a resistance of the thermal resistor; and adjusting the resistance of the thermal resistor by the adjusting amount through current-carrying heating of the thermal resistor.

2. A method for producing a semiconductor integrated circuit according to claim 1, wherein the current-carrying heating is conducted by using a current source.

3. A method for producing a semiconductor integrated circuit according to claim 2, said forming step comprising the steps of:

forming a tungsten silicide nitride film on a semiconductor substrate by reactive sputtering under a nitrogen partial pressure of 0.1 mTorr or higher;

patterning the tungsten silicide nitride film in a predetermined pattern to form the thermal resistor containing at least about 5% by weight of silicon and having a negative temperature coefficient; and forming a pair of electrodes to be connected to the thermal resistor.

4. A method for producing a semiconductor integrated circuit according to claim 3, further comprising the step of forming another circuit portion on the semiconductor substrate.

5. A method for producing a semiconductor integrated circuit according to claim 3, wherein the tungsten silicide nitride film is formed by reactive sputtering in a reduced-pressure atmosphere containing nitrogen gas with a target made of tungsten silicide containing silicon.

* * * * *